United States Patent [19]
Erhart et al.

[11] Patent Number: 5,389,872
[45] Date of Patent: Feb. 14, 1995

[54] SIGNAL PROCESSING SYSTEM AND METHOD OF REDUCING SWITCH ERROR ATTRIBUTABLE TO SWITCH IMPEDANCES

[75] Inventors: Richard A. Erhart, Chandler, Minn.; Matthew P. Hanly, Scottsdale, Ariz.

[73] Assignee: Medtronic, Inc., Minneapolis, Minn.

[21] Appl. No.: 51,109

[22] Filed: Apr. 21, 1993

[51] Int. Cl.⁶ .................................................. G05F 3/08
[52] U.S. Cl. ...................................... 323/354; 323/369
[58] Field of Search ................ 323/297, 298, 353, 354, 323/364, 367, 369

[56] References Cited

U.S. PATENT DOCUMENTS 4,810,949 3/1989 Schiemenz et al. .................. 323/354

*Primary Examiner*—Steven L. Stephan
*Assistant Examiner*—Y. Jessica Han
*Attorney, Agent, or Firm*—Harold R. Patton

[57] ABSTRACT

A system and method minimizing switching errors in voltages delivered to a resistive load. Switch impedances can be significant when small resistor values are utilized. A system relies on varying the resistance in the switches to compensate for the output voltage errors. The selection of a particular CMOS input transmission gate depends upon which outputs of a resistor divider are selected. In concept, a system is created which replaces each input transmission gate with a resistor and a zero impedance switch. The combination of properly selected CMOS input transmission gates results in output offset voltage errors which are greatly reduced due to the matching impedances of the individual switches.

9 Claims, 16 Drawing Sheets

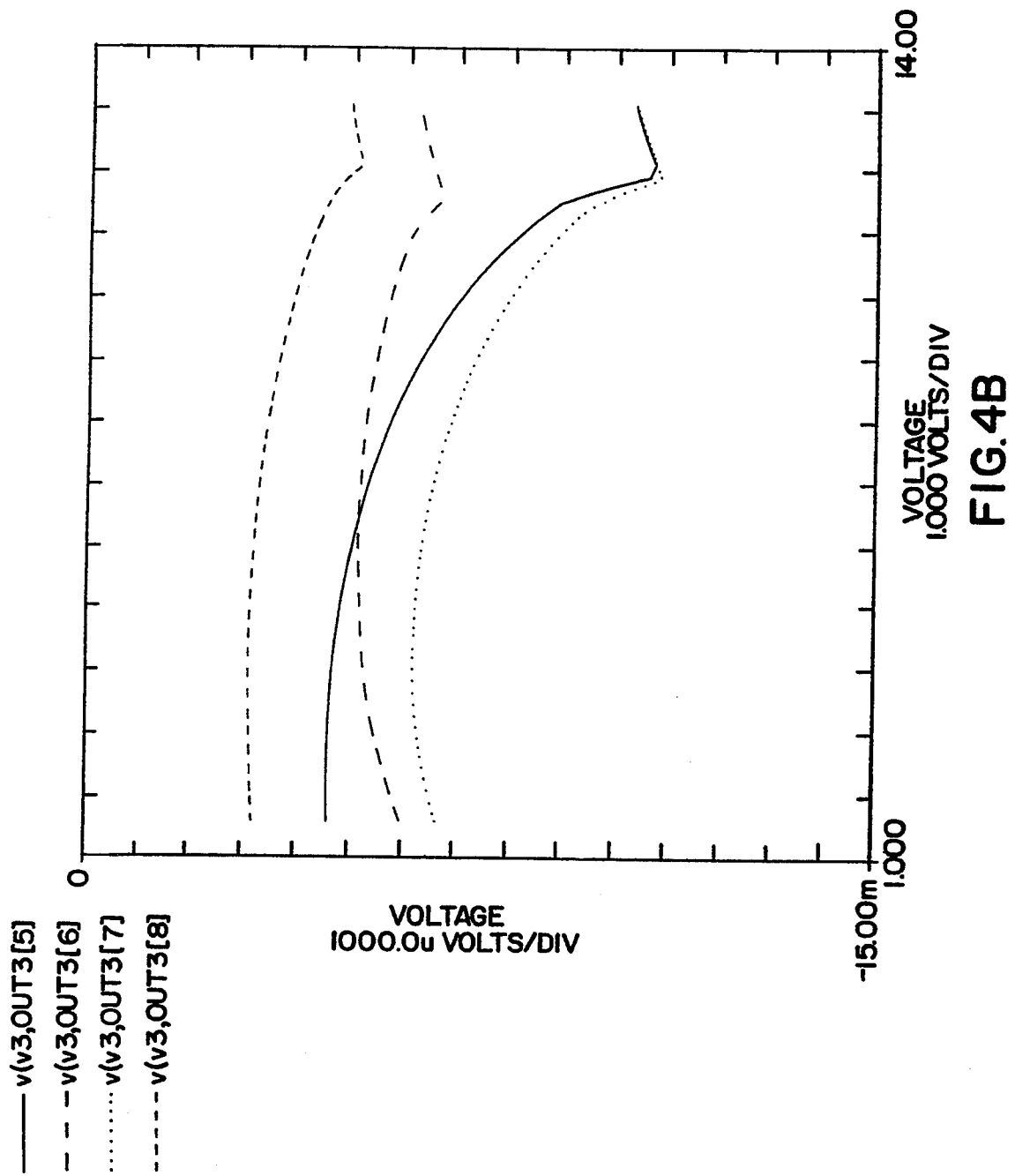

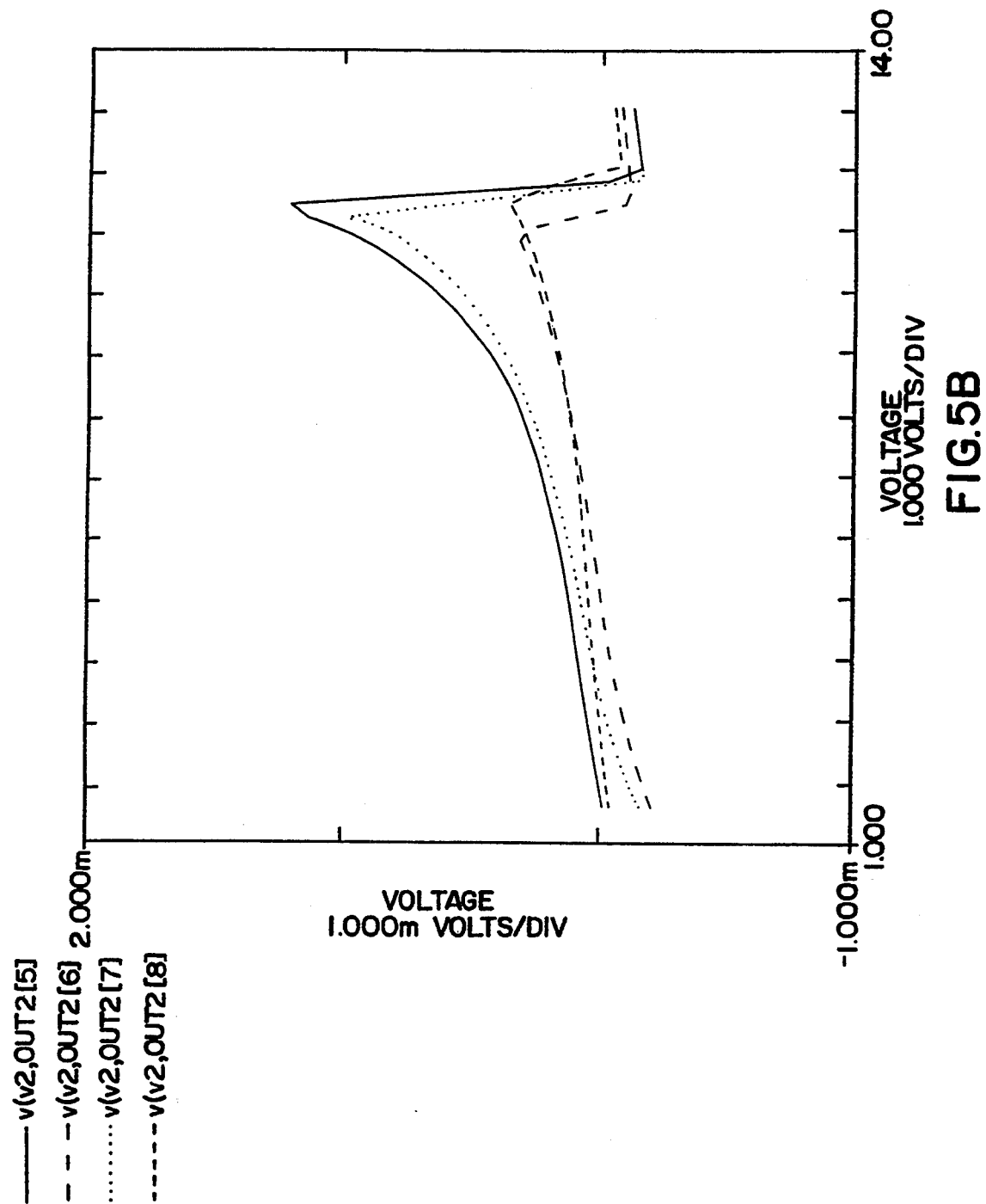

| VOUT SELECTION | SWITCH SETTINGS | | | | | |
|---|---|---|---|---|---|---|
| | 1 | 2 | 3 | 4 | 5 | 6 |
| IF OUT4 IS SELECTED | O | O | O | C | C | C |
| IF OUT3 IS SELECTED | C | O | O | C | C | C |
| IF OUT2 IS SELECTED | C | C | C | C | C | C |
| IF OUT1 IS SELECTED | C | C | C | C | O | O |

O=OPEN
C=CLOSED

SIGNAL PROCESSING SYSTEM AND METHOD OF REDUCING SWITCH ERROR ATTRIBUTABLE TO SWITCH IMPEDANCES

BACKGROUND OF THE INVENTION

1. Field of the Invention

The present invention pertains to switched resistor arrays, and in particular pertains to a system and method which significantly reduces switch error while permitting large impedances of the switches.

2. Description of the Prior Art

Applications for flat panel displays (active matrix, passive matrix, EL, . . . ) are growing. For example, active matrix displays can provide advantages over conventional LCD's in the areas of viewing angle, response time and information content. Military and commercial applications such as cockpit displays, mapping displays and imaging systems can utilize these features to create extremely accurate image reproductions.

A new generation of complex driver chips are required to implement these systems. For instance, there is a need for "next generation" IC's which can take full advantage of the capabilities of current and upcoming flat panel displays by providing extreme image accuracy. Such image accuracy is obtained at the expense of space. Space is a primary concern in applications using flat panel displays because the display driver IC chips will have thousands of connections between the driver chips and the display due to the large number of display driver chips required in these applications.

Current system architectures for LCD drivers employ both row and column driver IC's. These drivers are high speed chips having responsibility for accurate generation of large numbers of voltage levels used to drive the flat panel displays. These IC's need to be fast, handle large voltages, have a multitude of outputs, provide low offset error, contain tens of thousands of transistors, and yet minimize power. These conflicting design issues require careful analysis in the light of current IC technology.

For example, current flat panel active matrix display systems utilize digital-to-analog (D/A) converters which may require output offset voltages to be within a ±12 mv tolerance over a 12 volt output range. This is equivalent to approximately 10 bit D/A accuracy. Such accuracy is not available in the existing art without increased die sizes attributable to the large switches necessary to achieve that accuracy. The impedance of the switches used for selecting various voltages or resistors can be a design issue when extremely accurate output voltages are necessary. Prior applications requiring low switch losses have simply used large switches with small impedances. Increased die sizes however, are not an option due to the space limitations associated with flat panel display drivers. This invention allows flat panel display driver technology to achieve the necessary accuracy while simultaneously meeting the limited space requirements necessary to manufacture flat panel display drivers.

SUMMARY OF THE INVENTION

The present invention is a system and method making it possible to manufacture flat panel active matrix display drivers having thousands of output switches per chip while retaining output offset voltages having approximately 10 bit D/A accuracy. The invention uses input DC voltages which are global to all output channels. These DC input voltages pass through switches before delivery to a series of resistors making up a resistor divider. The impedance of the switches used to pass the input voltages causes errors in the voltages delivered to the series resistors. Such errors can be significant when small resistor values are utilized. The present invention relies on varying the resistance in the switches to compensate for the output voltage errors.

The selection of a particular CMOS input transmission gate depends upon which outputs of the resistor divider are selected. In concept, a system is created which replaces each input transmission gate with a resistor and a zero impedance switch. The combination of properly selected CMOS input transmission gates results in output offset voltage errors which are now de minimis due to the matching impedances of the individual switches.

BRIEF DESCRIPTION OF THE DRAWINGS

Other objects of the present invention and many of the attendant advantages of the present invention will be readily appreciated as the same becomes better understood by reference to the following detailed description when considered in connection with the accompanying drawings, in which like reference numerals designate like parts .throughout the figures thereof and wherein:

FIG. 4B depicts a simulation of the output error voltage at output channel 3 of the resistor divider network for four additional manufacturing process variations of the device,illustrated in FIG. 2B.

FIG. 5B depicts a simulation of the output error voltage at output channel 2 of the resistor divider network for four additional manufacturing process variations of the device illustrated in FIG. 2B.

DETAILED DESCRIPTION OF THE PREFERRED EMBODIMENT

Figure 1:
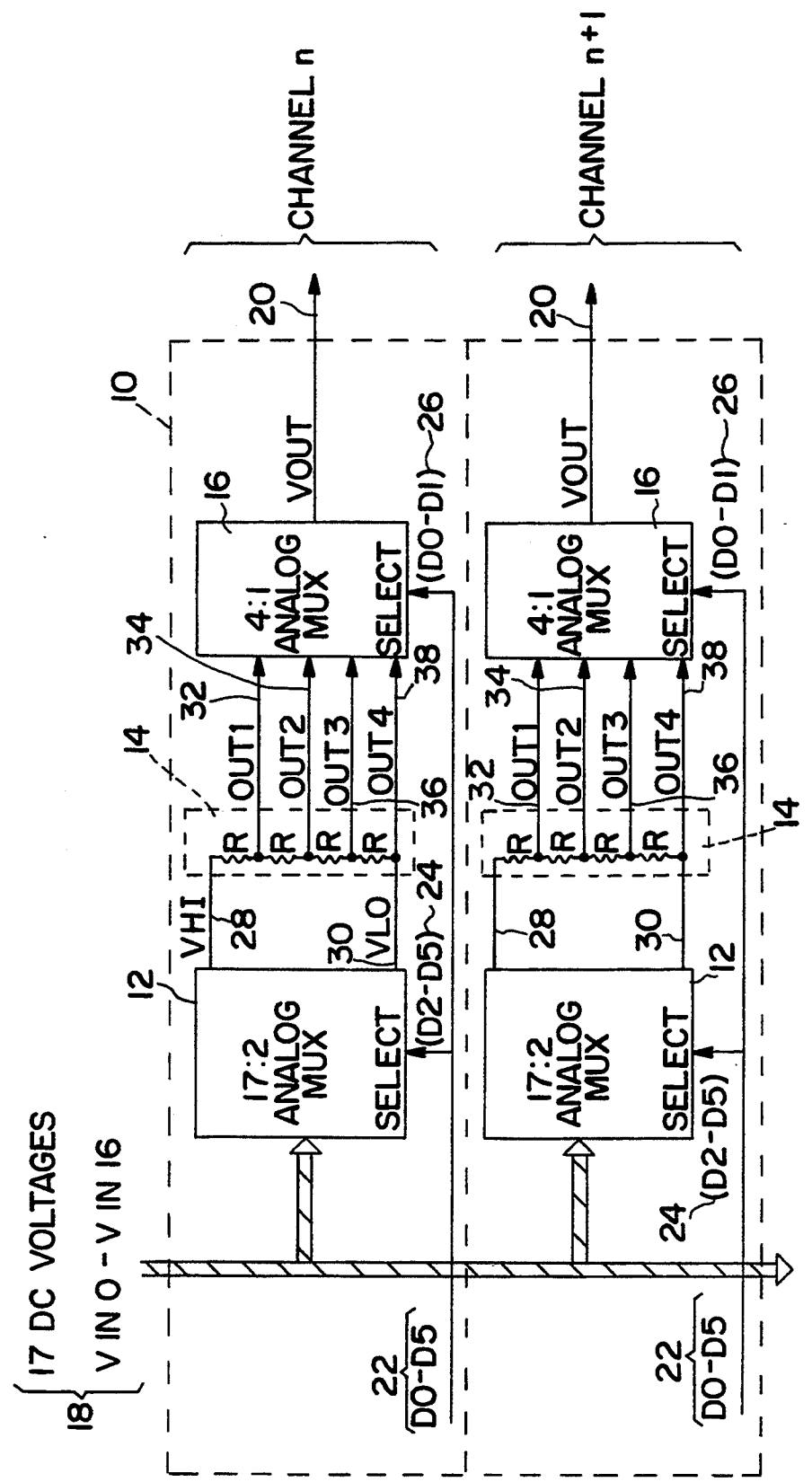
FIG. 1 illustrates a system including a 17:2 MUX, a resistor divider network, and a 4:1 MUX, in which input DC voltages are global to all of the system output channels.

The preferred embodiment of the present invention will be discussed with reference to FIG. 1 which illustrates a system 10 including a 17:2 multiplexer (MUX) 12, a resistor divider network 14, and a 4:1 multiplexer (MUX) 16, in which input DC voltages 18 are global to all of the system 10 output channels 20. This system 10 demonstrates a common design technique employed in analog circuits to accomplish voltage division. FIG. 1 is presented to provide a background and a setting for explaining the operation of the preferred embodiment of the present invention. Referring now to FIG. 1, 17 DC input voltages 18, which are global to all output channels 20, are shown as $V_{in}0$–$V_{in}16$. The four most significant bits (MSB's) 24 of the 6-bit digital channel system 10 input 22 are used as the select lines to a 17:2 analog multiplexer (MUX) 12. The output of this MUX 12 is an adjacent voltage pair VHI 28 and VLO 30 ($V_{in}0$ and $V_{in}1$, or $V_{in}1$ and $V_{in}2$, or ... $V_{in}15$ and $V_{in}16$) that is presented as the input to a resistor divider 14 which divides the input voltage pair 28, 30 into four equally spaced voltages 32, 34, 36 and 38. These voltages 32, 34, 36 and 38 are then sent to a 4:1 analog MUX 16. The two least significant bit (LSB) digital inputs 26 select one of these four voltages 32, 34, 36, 38 to be presented to an output channel 20. The overall function is to provide one of 64 voltages to the output channel 20 based on the value of the 6-bit digital input 22.

The problem addressed by the present invention arises in the 17:2 MUX 12. The impedance of the switches within the MUX 12 used to pass the input voltages 18 causes errors in the voltages 28, 30 delivered to the series resistors 14. These errors can be significant when small resistor 14 values are utilized.

Figure 2A:
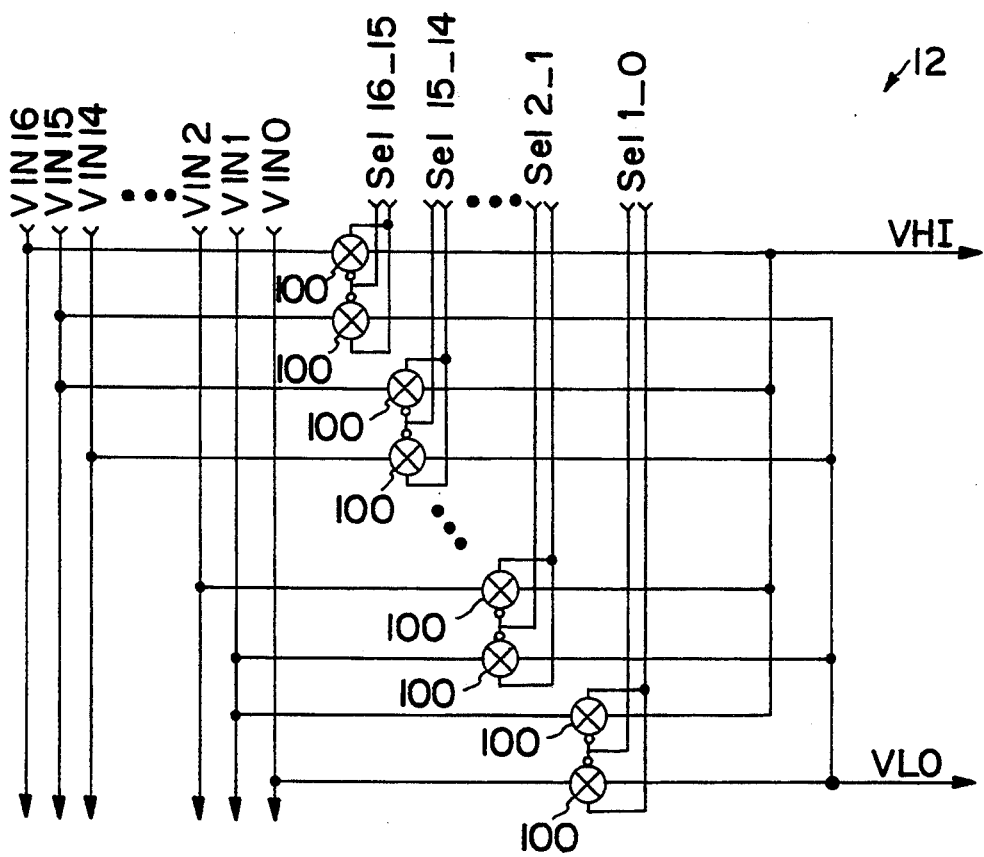
FIG. 2A is a detailed illustration of the 17:2 MUX portion of the system depicted in FIG. 1 which utilizes CMOS transmission gates as the analog switches.

Moving now to FIG. 2A, there is illustrated a more detailed diagram of the previous design for the 17:2 MUX 12 which utilizes CMOS transmission gates as the analog switches 100. In this embodiment, a total of 32 switches 100 are necessary for this function.

Figure 2B:
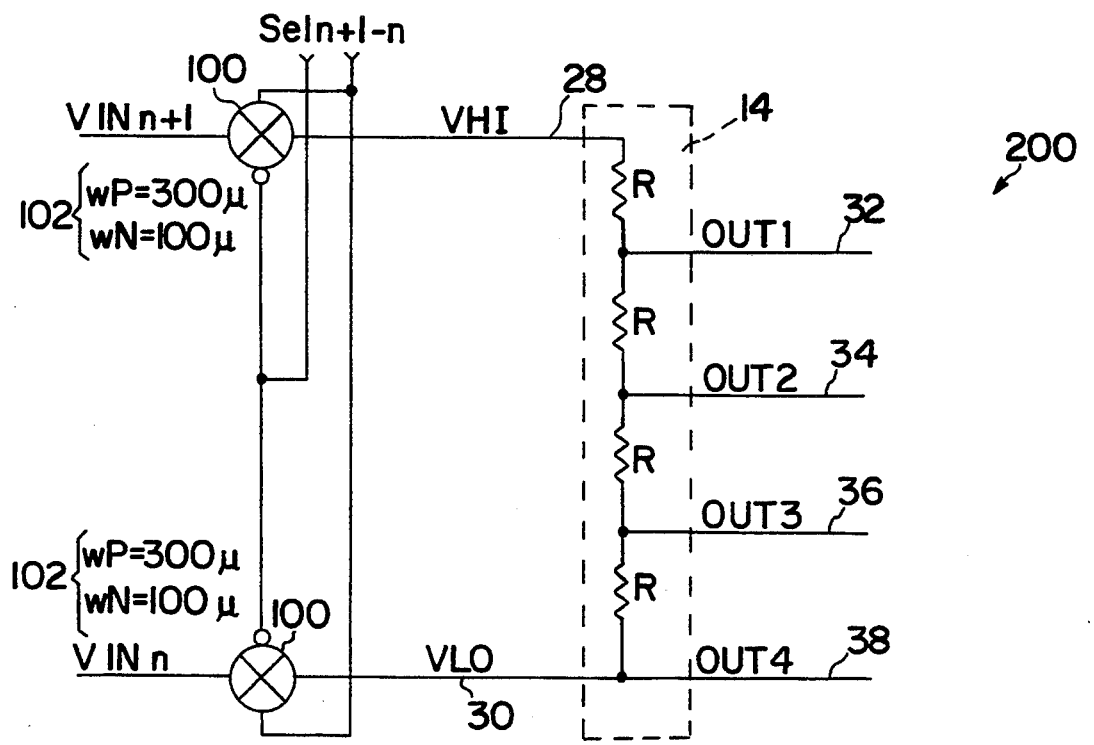
FIG. 2B illustrates a selected pair of the switches depicted in FIG. 2A, with device sizes shown, and the resistor divider network illustrated in FIG. 1 connected across the selected switch outputs.

FIG. 2B depicts a selected pair of the switches 100, with varying manufacturing processes 102 shown, and the four resistors 14 connected across the switch 100 outputs 28 and 30. The impedance of the switches 100 will cause a voltage drop across switch 100 outputs 28 and 30.

FIGS. 3-6 show simulations of the output error voltage at each of the four outputs 32, 34, 36, 38 of the resistor divider 14 for varying manufacturing processes 102. The signals shown represent the actual voltage minus the voltage which ideally should have been present. It can be seen that for various output voltages, the error voltage approaches 30 millivolts in some instances. Such large error voltages cannot be tolerated for example, in flat panel active matrix display driver applications where extremely accurate image reproductions are required. Thus, there exists a need to replace the prior art MUX 12 illustrated in FIG. 2B with a MUX that has error voltages at least an order of magnitude smaller than the error voltages produced with the prior art MUX 12.

Figure 7:
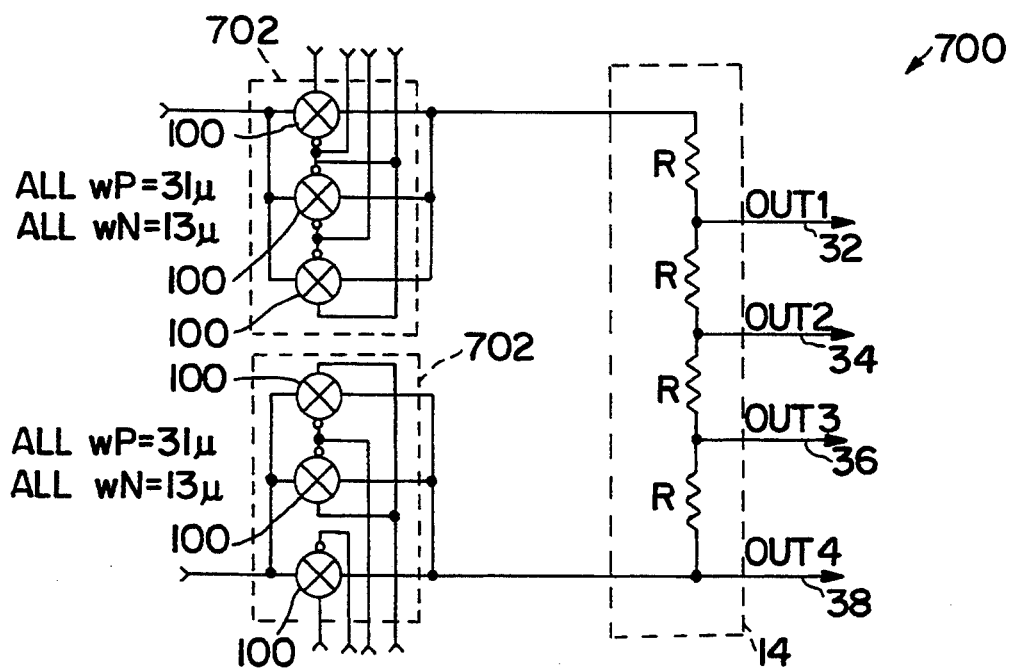
FIG. 7 illustrates a preferred embodiment of the present invention which replaces the implementation of FIG. 2B.

FIG. 7 illustrates one preferred embodiment 700 of the present invention which is capable of replacing the device cell 200 depicted in FIG. 2B, thereby reducing the output error voltage by at least one order of magnitude. In the preferred embodiment 700, each CMOS transmission gate (switch) 100 has been replaced by three transmission gates (switches) 702, but of smaller total size. The total silicon area for this device cell 700 is less than that necessary for the implementation of the previous embodiment illustrated in FIG. 2B.

The present invention relies on varying the resistance in the switches 100 to compensate for the output voltage errors that are otherwise inherent in the previous embodiment. The selection of the CMOS transmission gates (switches) 100 depends upon which of the four outputs 32, 34, 36, 38 of resistor divider 14 are selected. In concept, this creates the circuit of FIG. 8A, which then replaces each transmission gate 100 with a resistor 802 and a zero impedance switch 804.

Figures 8A, 8B:
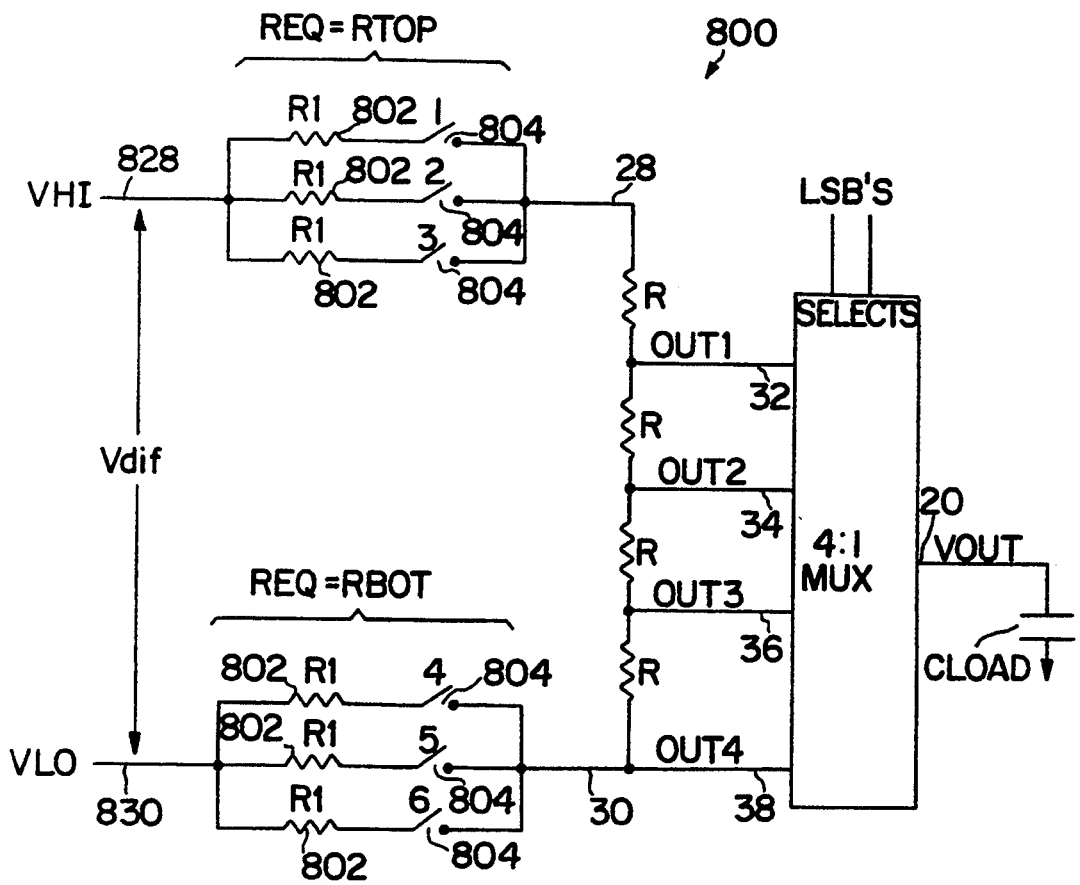
FIGS. 8A and 8B illustrate a simplified equivalent of the preferred embodiment depicted in FIG. 7 showing replacement of each transmission gate with a resistor and a zero impedance switch including a table of possible switch settings which make the embodiment operative.

Using FIG. 8A, the following analysis illustrates how the switches 100 are selected based on the two LSB's 26:

If the fourth output (Out4) 38 is selected, there is no need to use any special combination of the resistors 802 associated with the VHI input 828 and the VLO input 830 since the VLO input 830 signal is passed directly to the output 20. This condition is satisfied for example, with switches 1, 2 and 3 (804) open and switches 4, 5 and 6 (804) closed.

If the third output (Out3) 36 is selected, the desired output voltage Vout 20 is:

$$V_{out} = 0.25 \times V_{dif} \qquad 1.$$

where $V_{dif}$ is the difference between the voltage appearing on the VHI input 828 and the voltage appearing on the VLO input 830. Using the conceptual equivalent embodiment 800 depicted in FIG. 8A, the actual output voltage Vout 20 is given by:

$$V_{out} = V_{dif} \times [(R + Rbot)/(Rtop + 4R + Rbot)] \qquad 2.$$

where Rbot is the equivalent resistance of the internal switch resistances 802 connected to the VLO input 830 and Rtop is the equivalent resistance of the internal switch resistances connected to the VHI input 828. Setting equation 2 equal to the desired output given by equation 1 and solving for Rbot gives:

$$4\times(R+Rbot)/(Rtop+4R+Rbot)=1 \qquad 5$$

$$4\times(R+Rbot)=Rtop+4R+Rbot$$

$$3Rbot=Rtop$$

$$Rbot=Rtop/3. \qquad 3.$$

Thus, closing switches 1, 4, 5 and 6 (804) while leaving switches 2 and 3 (804) open will give the desired result given by equation 3 above thereby achieving a zero error condition at output (Vout) 20.

If the second output (Out2) 34 is selected, a similar solution following the above steps given by equations 1–3 for (Out3) 36 can be found to show that Rbot=-Rtop will achieve a zero error condition at Vout 20. For example, closing all of the switches 1, 2, 3, 4, 5 and 6 (804) will achieve the desired result.

If the first output (Out1) 32 is selected, a similar solution following the above steps given by equations 1–3 for (Out3) 36 can be found to show that Rtop=Rbot/3 will achieve a zero error condition at Vout 20. This result can be achieved by closing switches 1, 2, 3 and 4 while leaving switches 5 and 6 (804) open.

Possible switch (804) settings which will achieve a zero error condition at Vout 20 for each selected output 32, 34, 36, 38 are shown in the table of FIG. 8B.

Figure 3A:
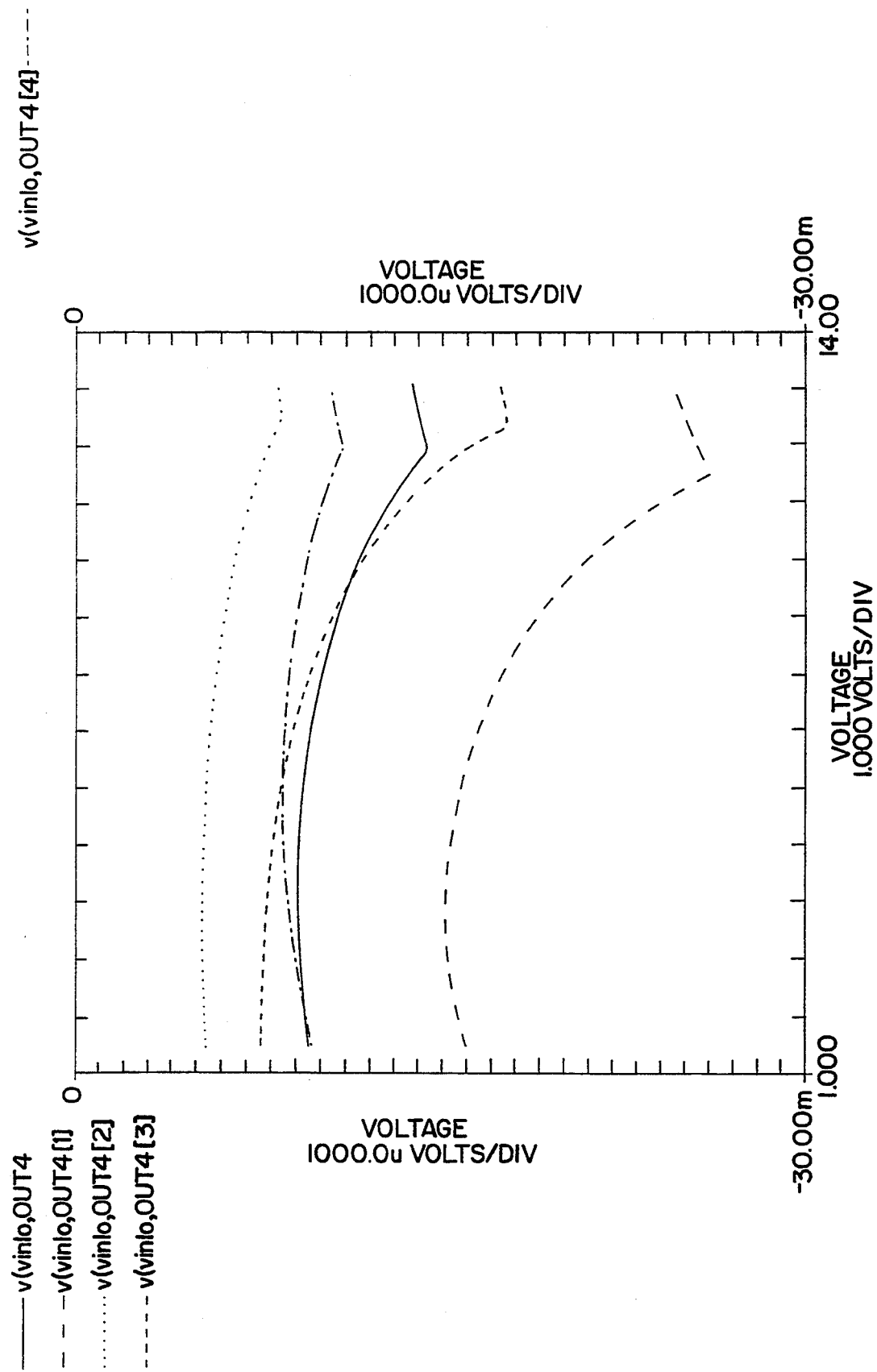
FIG. 3A depicts a simulation of the output error voltage at output channel 4 of the resistor divider network for four manufacturing process variations of the device illustrated in FIG. 2B.
Figure 3B:
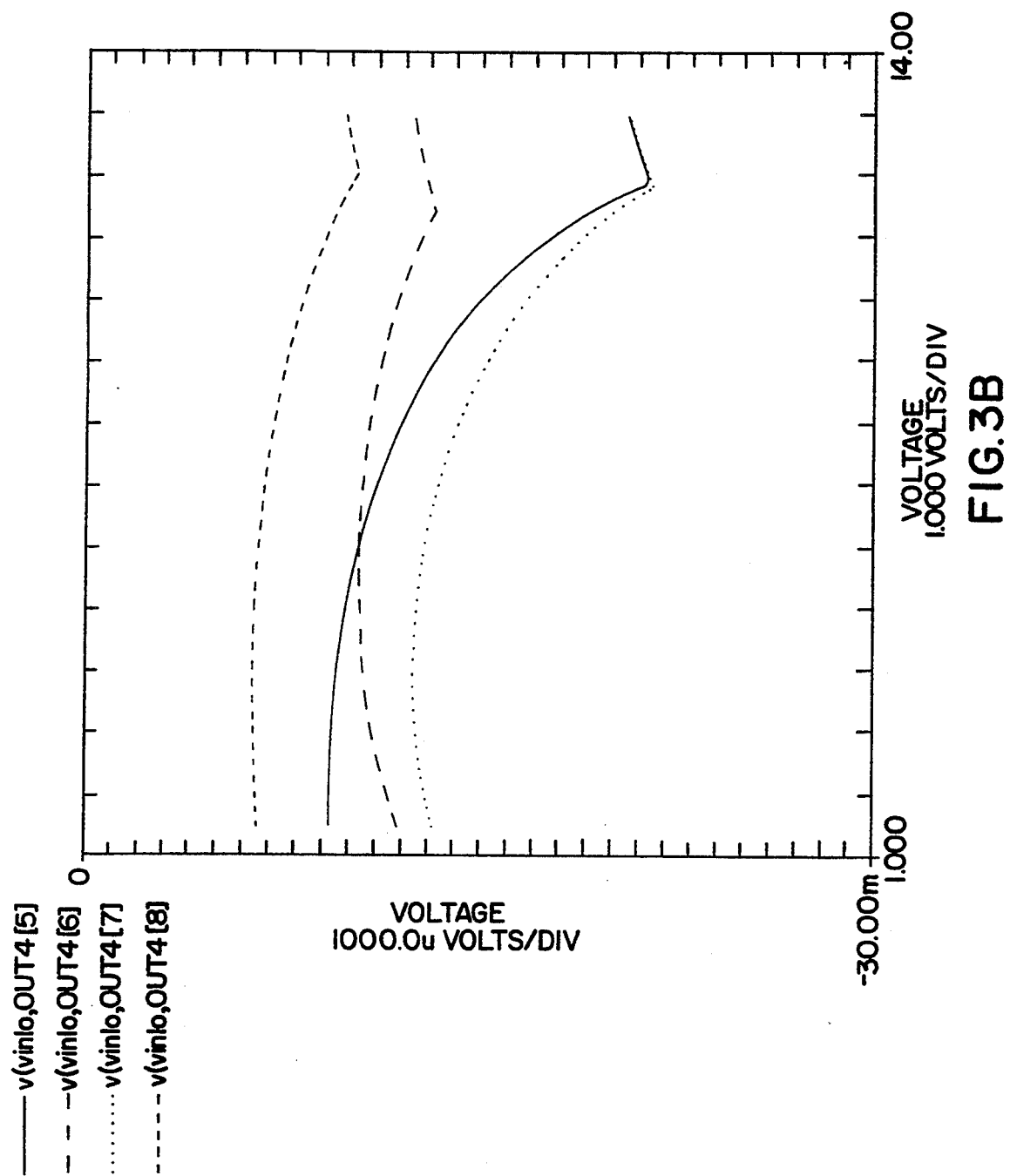
FIG. 3B depicts a simulation of the output error voltage at output channel 4 of the resistor divider network for tour additional manufacturing process variations of the device illustrated in FIG. 2B.
Figure 4A:
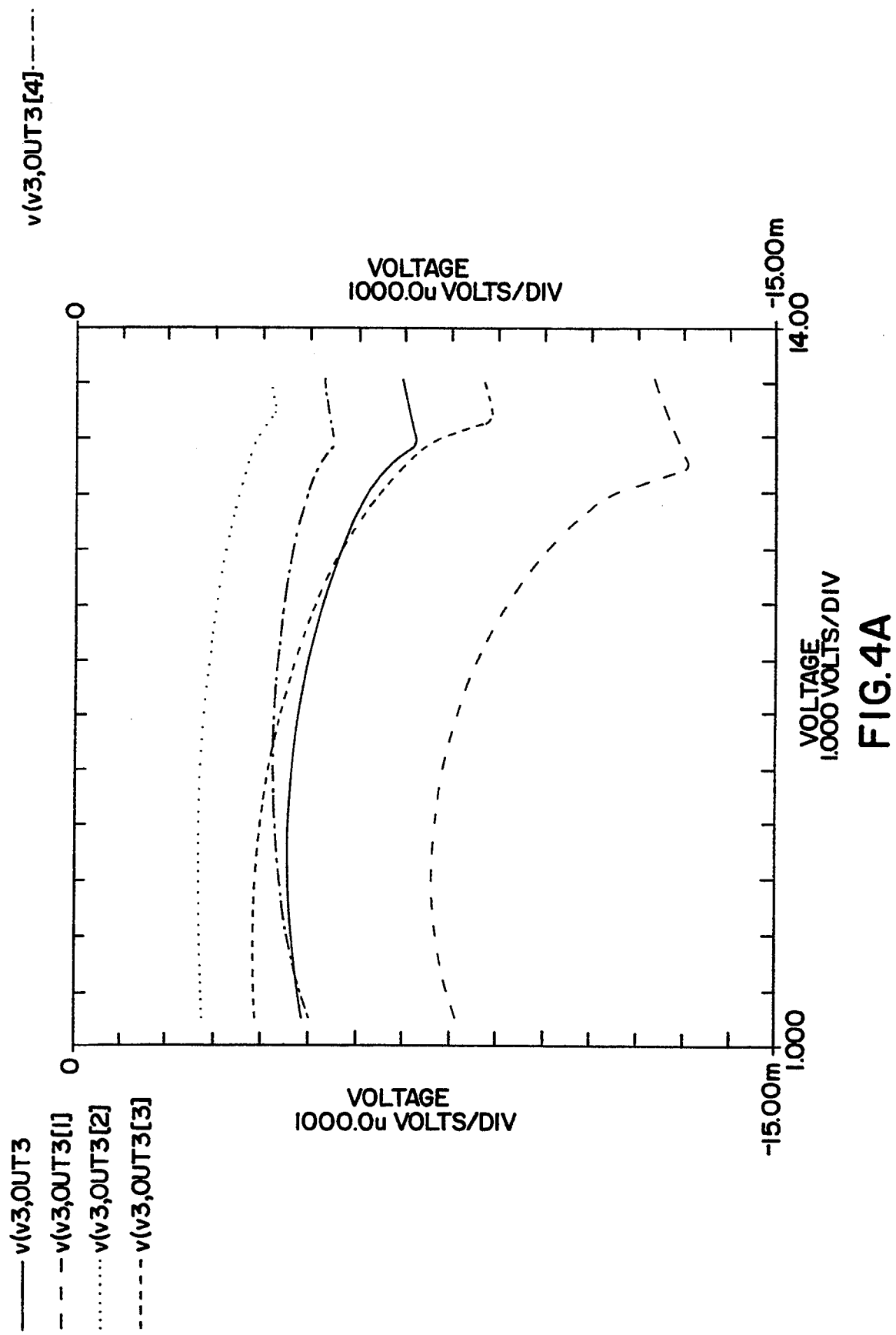
FIG. 4A depicts a simulation of the output error voltage at output channel 3 of the resistor divider network for four manufacturing process variations of the device illustrated in FIG. 2B.
Figure 5A:
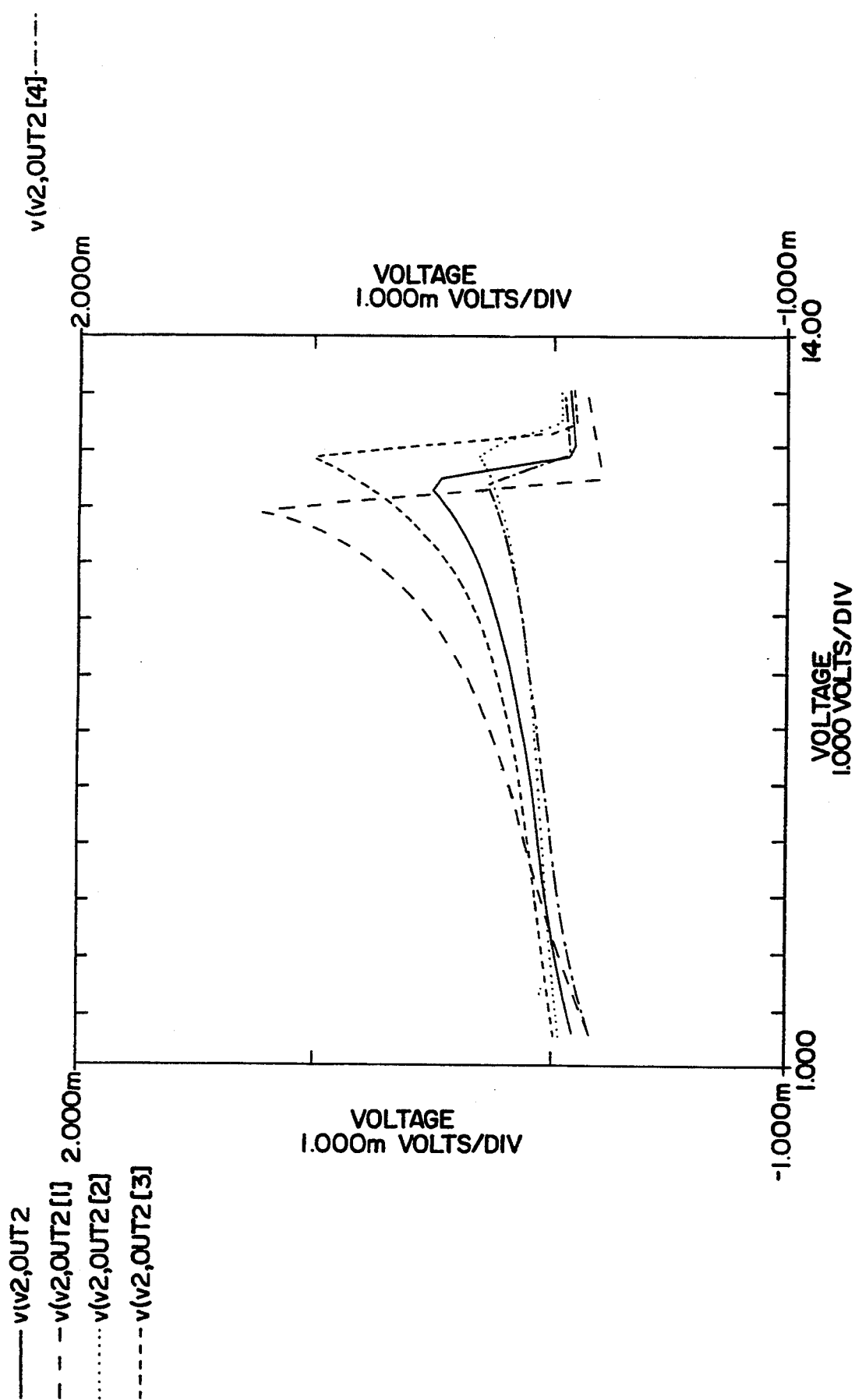
FIG. 5A depicts a simulation of the output error voltage at output channel 2 of the resistor divider network for four manufacturing process variations of the device illustrated in FIG. 2B.
Figure 6A:
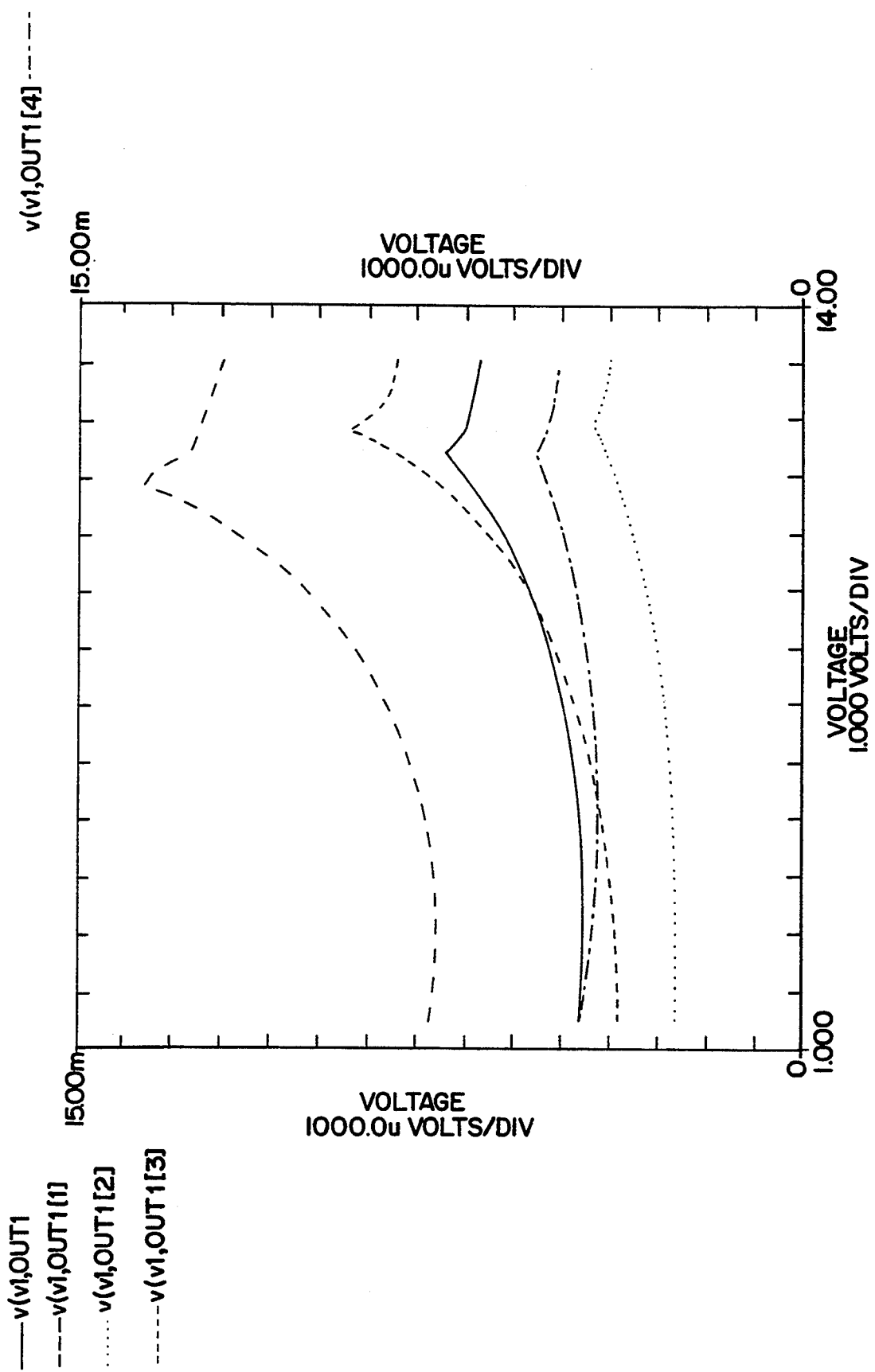
FIG. 6A depicts a simulation of the output error voltage at output channel 1 of the resistor divider network for four manufacturing process variations of the device illustrated in FIG. 2B.
Figure 6B:
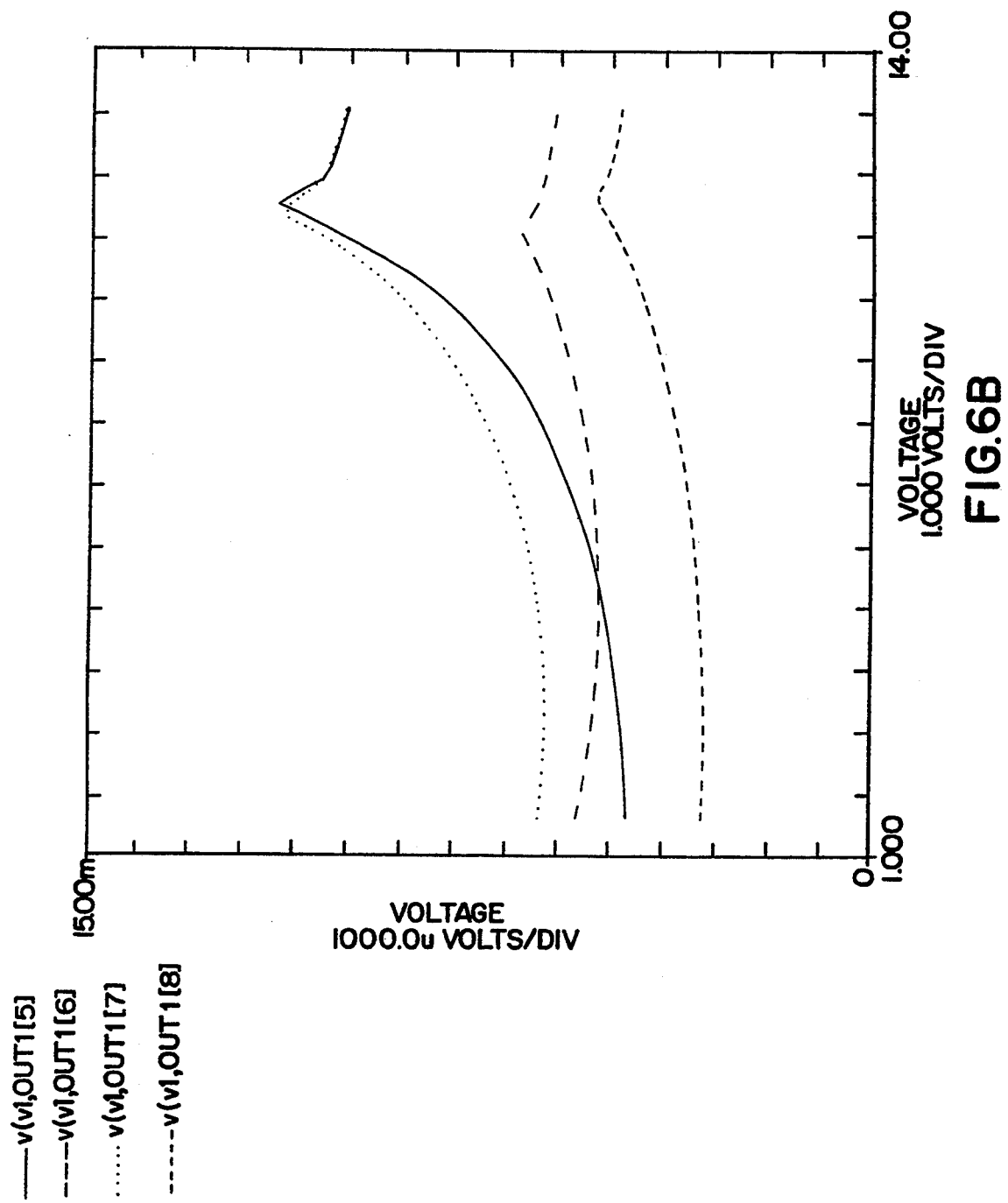
FIG. 6B depicts a simulation of the output error voltage at output channel 1 of the resistor divider network for four additional manufacturing process variations of the device illustrated in FIG. 2B.
Figure 9:
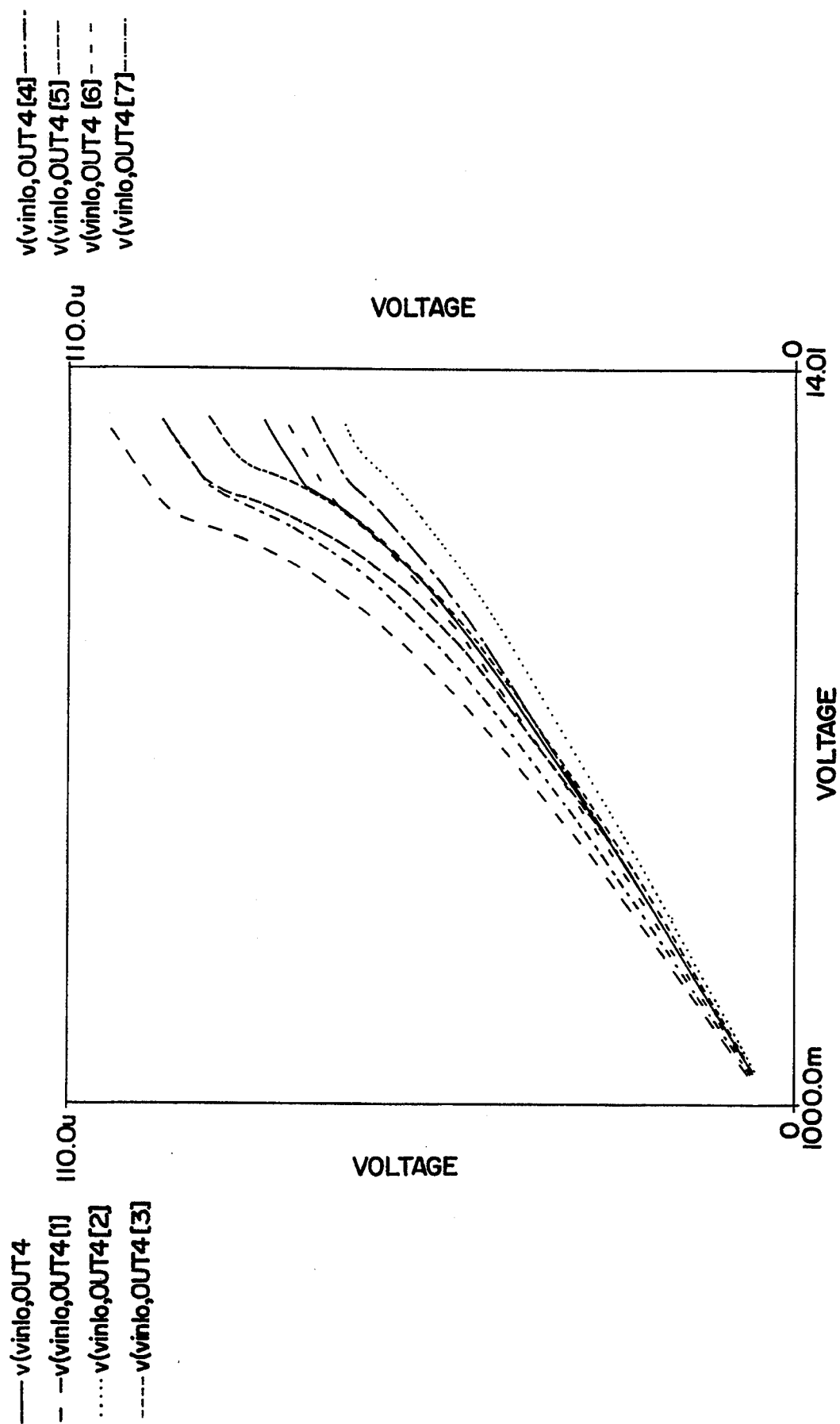
FIG. 9 depicts a simulation of the output error voltage at output channel 4 of the resistor divider network for eight manufacturing process variations of the device preferred embodiment illustrated in FIG. 7.
Figure 10:
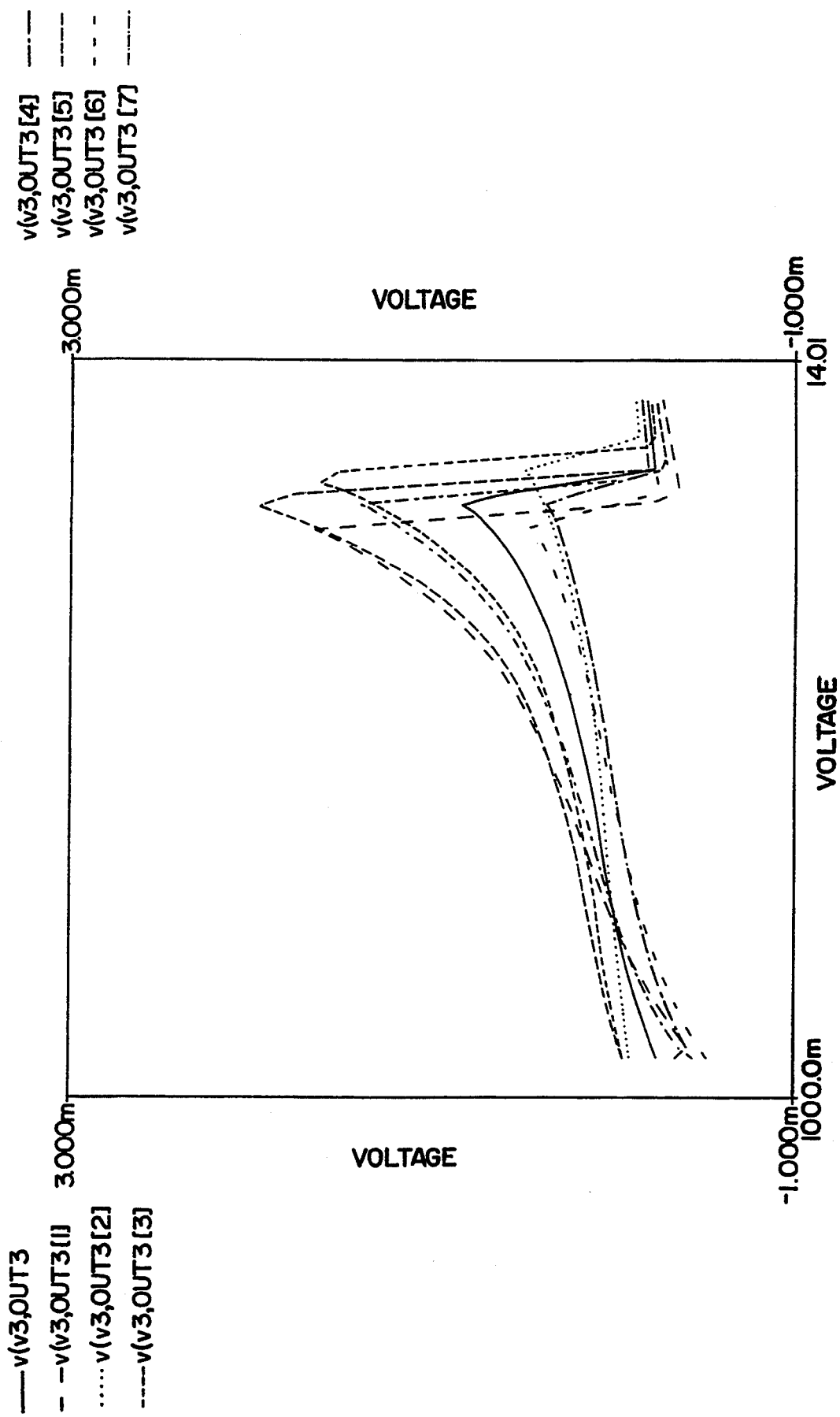
FIG. 10 depicts a simulation of the output error voltage at output channel 3 of the resistor divider network for eight manufacturing process variations of the device preferred embodiment illustrated in FIG. 7.
Figure 11:
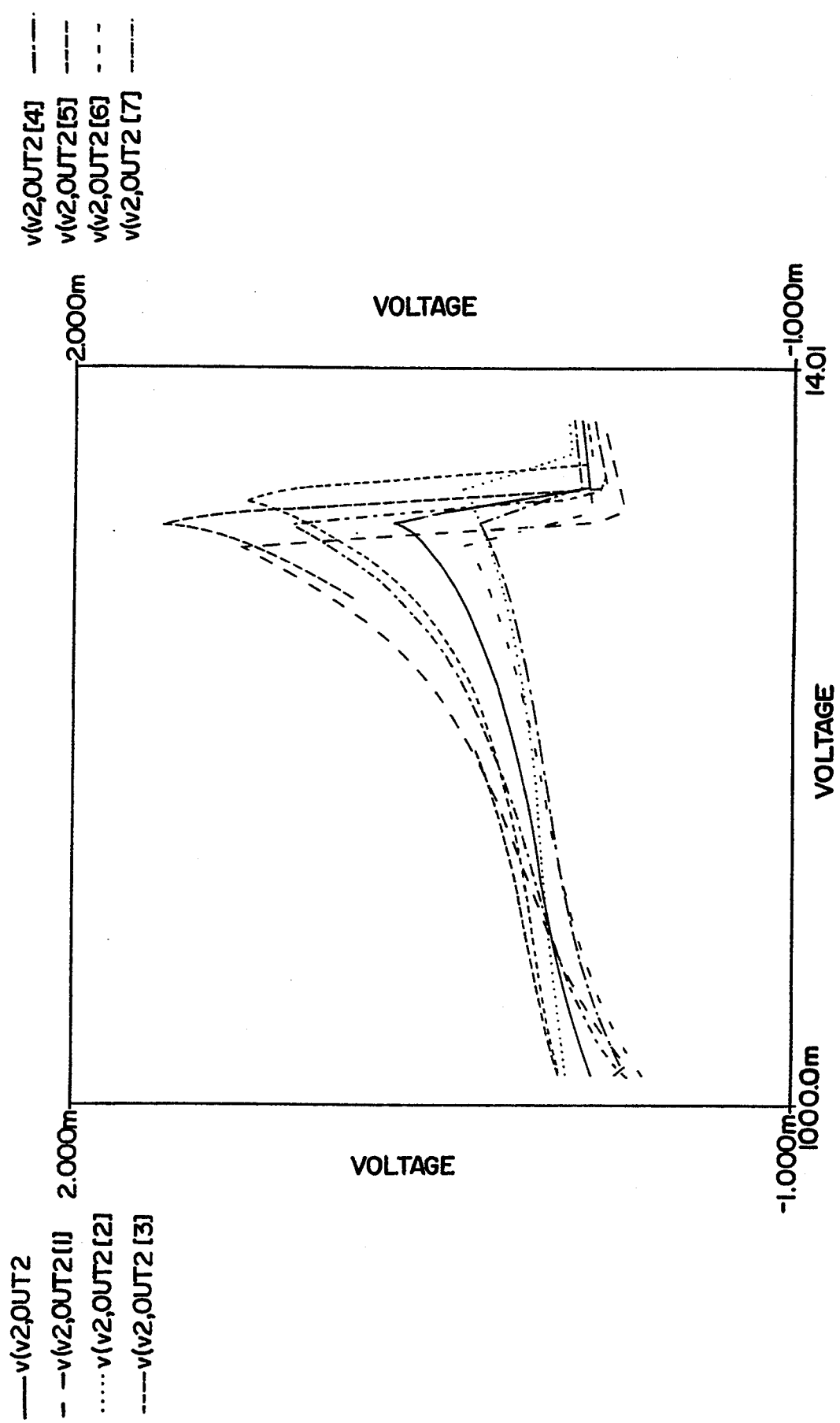
FIG. 11 depicts a simulation of the output error voltage at output channel 2 of the resistor divider network for eight manufacturing process variations of the device preferred embodiment illustrated in FIG. 7.
Figure 12:
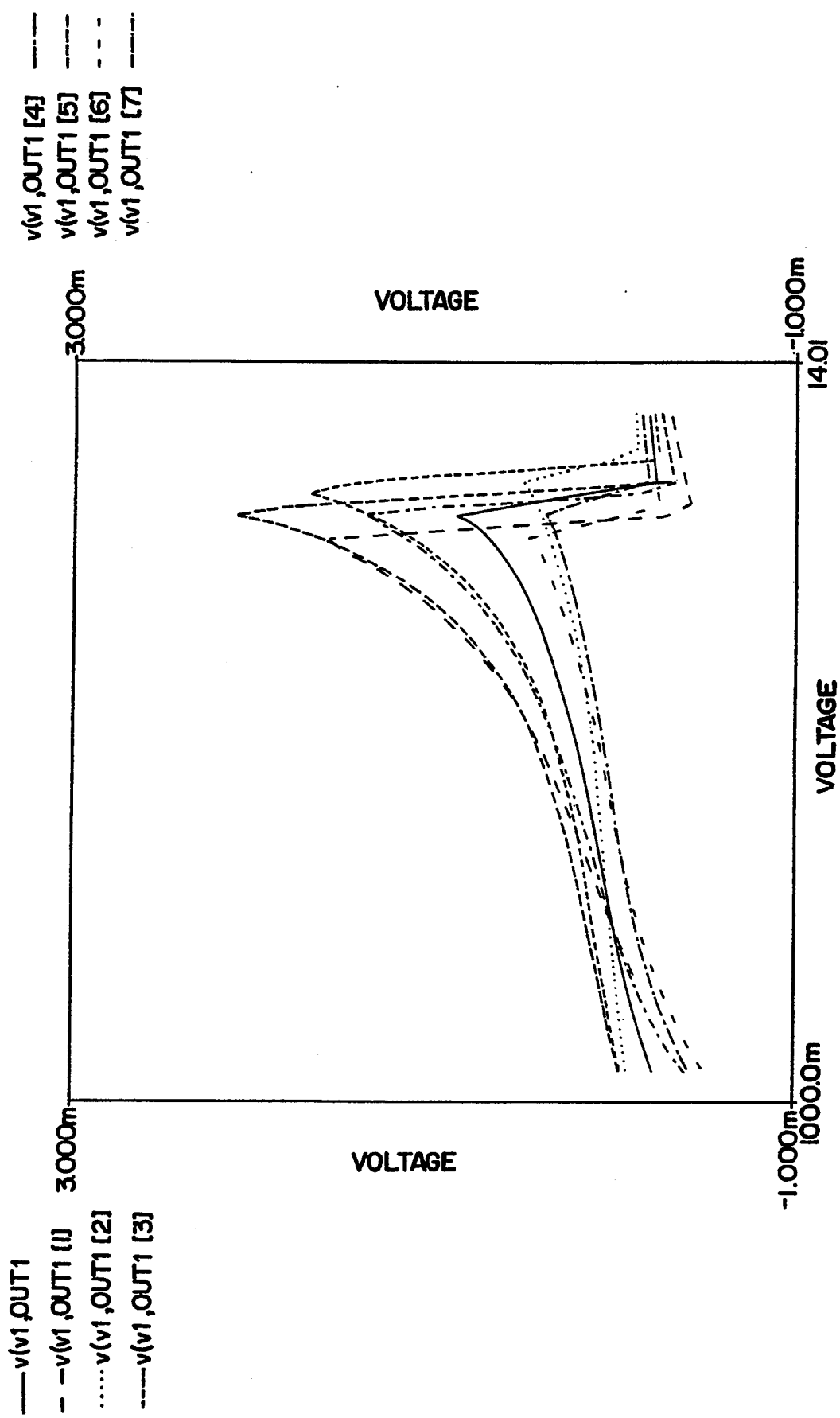
FIG. 12 depicts a simulation of the output error voltage at output channel 1 of the resistor divider network for eight manufacturing process variations of the device preferred embodiment illustrated in FIG. 7.

Moving now to FIGS. 9–12, there is shown simulations of the error voltage for the embodiment 700 using the new invention. It can be seen that the transistor sizes (WP, WN) previously used for the switches 100 have been reduced substantially and yet the error has been significantly reduced. For example, FIG. 3B shows an error voltage on the fourth output (Out4) 38 as large as about 22 millivolts for the previous embodiment 200 illustrated in FIG. 2B, while FIG. 9 shows a maximum error voltage of about 100 microvolts for output 38 when the previous embodiment 200 is replaced with the inventive embodiment 700 illustrated in FIG. 7. It should be noted, as shown in the voltage error simulations depicted in FIGS. 9–12, there are still some switch 100 errors associated with the present inventive approach, even though the mathematical calculations described hereinbefore would tend to indicate zero error is possible. The present invention relies on the matching impedances of the individual switches 100. There are two contributors to the remaining error. The first is a device 100 size matching error. This error can be controlled to 1% or less, even for small device sizes as used by the present invention. The second is the fact that all of the switches 100 do not have the same bias point. The impedance of a metal-oxide-semiconductor (CMOS) device is given by:

$$Ron=1/(K'\times W/L\times(Vgs-Vt)) \qquad 4.$$

In the preferred embodiment for the present invention, the switches 100 which form Rtop will have a different Vgs than the switches 100a which form Rbot, giving a slight change in the impedance. This error could be designed out if the difference was a known value for all applications.

The percentage error due to the device 100 size matching error and the impedance error between Rtop and Rbot is a percentage of the possible error voltage however, and not of the total voltage. As such, this means that even a 10% error in impedance matching will still have a significant improvement over the prior art technique for the same size switches 100.

While the invention has been described above in connection with a particular embodiment, one skilled in the art will appreciate that the invention is not necessarily so limited. It will thus be understood that numerous other embodiments, examples, uses, modifications of, and departures from the teachings disclosed may be made, without departing from the scope of the present invention as claimed herein.

We claim:

1. A monolithic switching system for minimizing switch errors while simultaneously permitting large switch impedances comprising:

a first plurality of switches having a common first switch input and a common first switch output;

a second plurality of switches having a common second switch input and a common second switch output; and a resistor divider network having a first network input and a second network input wherein said first network input is coupled to said first switch output and said second network input is coupled to said second switch output.

2. The switching system of claim I wherein said resistor divider network has a plurality of network outputs.

3. The switching system of claim 1 wherein said first plurality of switches are individually and independently selectable from one another and said second plurality of switches are individually and independently selectable from one another, and wherein said first plurality of switches and said second plurality of switches are individually and independently selectable from one another.

4. The switching system of claim 2 wherein said first plurality of switches are individually and independently selectable from one another and said second plurality of switches are individually and independently selectable from one another, and wherein said first plurality of switches and said second plurality of switches are individually and independently selectable from one another.

5. The switching system of claim 3 wherein said individual and independent selection of said first plurality of switches and said individual and independent selection of said second plurality of switches and said individual and independent selection of said first and second plurality of switches is determined by a selection of any one of said plurality of network outputs.

6. The switching system of claim 4 wherein said individual and independent selection of said first plurality of switches and said individual and independent selection of said second plurality of switches and said individual and independent selection of said first and second plurality of switches is determined by a selection of any one of said plurality of network outputs.

7. The switching system of claim 3 wherein said individual and independent selection of said first plurality of switches and said individual and independent selection of said second plurality of switches and said individual and independent selection of said first and second plurality of switches is determined by a selection of any single combination of said plurality of network outputs.

8. The switching system of claim 4 wherein said individual and independent selection of said first plurality of switches and said individual and independent selection of said second plurality of switches and said individual and independent selection of said first and second plurality of switches is determined by a selection of any single combination of said plurality of network outputs.

9. A method of reducing signal processing system output signal offset errors attributable to switch impedances within a signal processing system comprising:

selecting an output port of a resistor divider network having equal valued network resistors;

applying a first excitation signal to a first common input port for a first plurality of switches;

applying a second excitation signal to a second common input port for a second plurality of switches;

outputting a differential excitation signal across a first common output port for said first plurality of switches and a second common output port for said second plurality of switches;

applying said differential excitation signal across a first input port and a second input port of said resistor divider network;

calculating a desired output signal level, said desired output signal level being equal to a product of a constant multiplier and said differential excitation signal;

calculating a second output signal level, said second output signal level being equal to a product of said differential excitation signal and a numerical ratio, said ratio being dependent on said resistor values for said resistor network, a first equivalent resistance for said first plurality of switches and a second equivalent resistance for said second plurality of switches;

equating the desired output signal level to said second output signal level to determine a relationship between said first equivalent resistance and said second equivalent resistance; and enabling a combination of switch settings for said first plurality of switches and said second plurality of switches to establish said relationship, wherein said combination of switch settings includes open and closed switches.

* * * * *